United States Patent
Perreault et al.

(10) Patent No.: US 6,996,953 B2
(45) Date of Patent: Feb. 14, 2006

(54) SYSTEM AND METHOD FOR INSTALLING A TAMPER BARRIER WRAP IN A PCB ASSEMBLY, INCLUDING A PCB ASSEMBLY HAVING IMPROVED HEAT SINKING

(75) Inventors: Paul G Perreault, Wallingford, CT (US); Douglas A Clark, Wallingford, CT (US); Kjell A Heitmann, Norwalk, CT (US)

(73) Assignee: Pitney Bowes Inc., Stamford, CT (US)

( * ) Notice: Subject to any disclaimer, the term of this patent is extended or adjusted under 35 U.S.C. 154(b) by 19 days.

(21) Appl. No.: 10/868,335

(22) Filed: Jun. 15, 2004

(65) Prior Publication Data
US 2005/0160702 A1    Jul. 28, 2005

Related U.S. Application Data

(60) Provisional application No. 60/538,545, filed on Jan. 23, 2004.

(51) Int. Cl.
*B65B 11/58* (2006.01)
(52) U.S. Cl. .......................... 53/449; 53/452; 53/455; 53/458; 493/100; 493/111; 206/706
(58) Field of Classification Search ................. 53/410, 53/449, 452, 455, 456, 458; 206/706, 709, 206/723; 493/100, 111, 98
See application file for complete search history.

(56) References Cited

U.S. PATENT DOCUMENTS

| 4,516,679 A | 5/1985 | Simpson et al. |
| 4,593,384 A | 6/1986 | Kleijne |
| 4,653,252 A * | 3/1987 | van de Haar et al. ........ 53/449 |
| 4,691,350 A | 9/1987 | Kleijne et al. |
| 4,807,284 A | 2/1989 | Kleijne |
| 4,811,288 A | 3/1989 | Kleijne et al. |
| 4,860,351 A | 8/1989 | Weingart |
| 5,117,457 A | 5/1992 | Comerford et al. |

(Continued)

FOREIGN PATENT DOCUMENTS

| DE | 19816571 A1 | 10/1999 |

(Continued)

OTHER PUBLICATIONS

FIPS PUB 140-2 Federal Information Processing Standards Publication—Security Requirements for Cryptographic Modules, Issued May 25, 2001.

*Primary Examiner*—Stephen F. Gerrity
*Assistant Examiner*—Hemant M. Desai
(74) *Attorney, Agent, or Firm*—Brian A. Lemm; Angelo N. Chaclas

(57) ABSTRACT

A method of attaching a tamper wrap to a printed circuit board using an installation tool that is placed over the main body portion of the tamper wrap. The side tabs of the tamper wrap are folded up against the side walls of the installation tool, and the tamper wrap and the installation tool are inserted into an enclosing case. The installation tool is then removed, the printed circuit board to be wrapped is placed into the enclosing case, and the side tabs are folded and adhered down onto the top surface of the printed circuit board. Also, a printed circuit board assembly having improved heat sinking capabilities including a thermally conductive material located between a printed circuit board and a tamper wrap such that the electronic components are in thermal contact with an enclosing case for enclosing the printed circuit board and the tamper wrap.

12 Claims, 5 Drawing Sheets

U.S. PATENT DOCUMENTS

| | | | |
|---|---|---|---|
| 5,201,868 A * | 4/1993 | Johnson | 229/103.11 |
| 5,211,618 A * | 5/1993 | Stoltz | 493/96 |
| 5,389,738 A | 2/1995 | Piosenka et al. | |
| 5,406,630 A | 4/1995 | Piosenka et al. | |
| 5,675,319 A | 10/1997 | Rivenberg et al. | |
| 5,715,652 A * | 2/1998 | Stahlecker | 29/512 |
| 5,858,500 A | 1/1999 | MacPherson | |
| 5,880,523 A | 3/1999 | Candelore | |
| 5,988,510 A | 11/1999 | Tuttle et al. | |
| 6,121,544 A * | 9/2000 | Petsinger | 174/35 R |
| 6,261,215 B1 * | 7/2001 | Imer | 493/210 |
| 6,424,954 B1 | 7/2002 | Leon | |
| 6,469,625 B1 | 10/2002 | Tomooka | |
| 6,643,995 B1 * | 11/2003 | Koyama et al. | 53/453 |
| 2001/0056542 A1 | 12/2001 | Cesana et al. | |
| 2002/0002683 A1 | 1/2002 | Benson et al. | |
| 2002/0084090 A1 | 7/2002 | Farquhar et al. | |

FOREIGN PATENT DOCUMENTS

| | | |
|---|---|---|
| DE | 19816572 A1 | 10/1999 |
| EP | 0629497 A2 | 12/1994 |
| EP | 1184773 A1 | 3/2002 |
| EP | 1207444 A2 | 5/2002 |
| GB | 2174830 A | 11/1986 |
| GB | 2297540 A | 8/1996 |
| GB | 2298391 A | 9/1996 |
| GB | 2330439 A | 4/1999 |
| WO | 99/21142 | 4/1999 |
| WO | 01/63994 A2 | 8/2001 |

* cited by examiner

SYSTEM AND METHOD FOR INSTALLING A TAMPER BARRIER WRAP IN A PCB ASSEMBLY, INCLUDING A PCB ASSEMBLY HAVING IMPROVED HEAT SINKING

CROSS-REFERENCE TO RELATED APPLICATIONS

This application claims the benefit of U.S. Provisional Application Ser. No. 60/538,545, filed on Jan. 23, 2004, the specification of which is hereby incorporated by reference.

FIELD OF THE INVENTION

The present invention relates to tamper detection and protection for electronic circuitry, and more particularly, to a system and method for attaching a tamper barrier wrap to a printed circuit board and to a tamper protected printed circuit board assembly having improved heat sinking capabilities.

BACKGROUND OF THE INVENTION

In many electronic applications, it is often desirable or even required to protect electronic circuitry, such as on a printed circuit board (PCB), from unlawful or unauthorized access. This is especially true for electronic circuitry that includes cryptographic modules or functionality. For example, postage security devices (PSDs) are required by the United States Postal Service to comply with FIPS 140-2 level 3 issued by the National Institute of Standards and Technology (NIST). FIPS 140-2 level 3 requires that PSDs have a full envelope of physical tamper protection and detection which encloses all electrical nodes.

Prior art methods of tamper protection, such as disclosed in U.S. Pat. No. 5,858,500, involve wrapping the entire electronic circuitry, such as a PCB, in a flexible tamper respondent laminate. The laminate in such methods is soldered to the electronic circuitry to complete the detection circuits and potted using an encapsulating epoxy or the like. This method requires many hand operations and, as a result, is cumbersome and prone to causing damage to the sensitive tamper barrier wrap.

In addition, PCBs typically include high performance integrated circuits that get hot during operation. A PCB that is wrapped for tamper protection purposes must include some way of dissipating the heat generated by the integrated circuits included with the PCB.

SUMMARY OF THE INVENTION

The present invention relates to a method of attaching a flexible tamper wrap to a printed circuit board, wherein the tamper wrap includes a main body portion and a plurality of side tabs extending from the main body portion. First, the tamper wrap is laid out flatly. Then, an installation tool is placed over the main body portion of the tamper wrap. The installation tool includes a plurality of side walls equal in number to the plurality of side tabs of the tamper wrap. Each of the side tabs is then folded up against a corresponding one of the side walls of the installation tool. The tamper wrap and the installation tool are then inserted into an enclosing case, and the installation tool is removed from the enclosing case. The printed circuit board to be wrapped is then placed into the enclosing case over the main body portion of the tamper wrap and the plurality of side tabs are folded and adhered down onto the top surface of the printed circuit board.

The method may further include the step of placing a locating frame on top of the main body portion of the tamper wrap. In this embodiment, the step of placing an installation tool over the main body portion further includes placing the installation tool on top of the locating frame, and the inserting step further includes inserting the locating frame into the enclosing case along with the tamper wrap and installation tool. The locating frame includes a plurality of side walls equal in number to the plurality of side tabs of the tamper wrap, and the folding step further includes folding each of the side tabs up against a corresponding one of the locating frame side walls. Each of the side tabs may have an adhesive on a first surface thereof, wherein the adhesive sticks to the locating frame side walls but does not stick to the installation tool side walls.

In an alternate embodiment, the method may also include the step of placing a locating frame on top of the main body portion of the tamper wrap after the step of removing the installation tool. In this embodiment, the step of placing the printed circuit board in the enclosing case further comprises placing the printed circuit board inside the locating frame.

The method may also include the step of placing a thermally conductive material on top of the main body portion after the step of removing the installation tool. In this embodiment, the step of placing the printed circuit board in the enclosing case further includes placing the printed circuit board on top of the thermally conductive material. The printed circuit board has an electronic component side, and this electronic component side is preferably in thermal contact with the thermally conductive material.

In one preferred embodiment, the installation tool has four side walls and a rectangular shape. Similarly, the tamper wrap has four side tabs.

In addition, a bottom surface of the main body portion of the tamper wrap may have an adhesive applied thereto. This adhesive causes the tamper wrap to be adhered to the enclosing case during the step of inserting the tamper wrap and installation tool into the enclosing case.

In one specific embodiment, the enclosing case includes a plurality of side walls equal in number to the plurality of side tabs. After the removing step and before the folding step in this embodiment of the method, each of the side tabs rests against a corresponding one of the side walls of the enclosing case.

The present invention also relates to a tamper protected printed circuit board assembly including a printed circuit board having a plurality of electronic components mounted on a first side thereof, a tamper wrap at least partially wrapping the printed circuit board, a thermally conductive material located between the first side of the printed circuit board and a first portion of the tamper wrap, the plurality of electronic components being in thermal contact with the first portion of the tamper wrap through the thermally conductive material, and an enclosing case for enclosing the printed circuit board and the tamper wrap, wherein the enclosing case is in thermal contact with the first portion of the tamper wrap. This configuration provides improved heat sinking to dissipate the heat generated by the electronic components of the printed circuit board.

Therefore, it should now be apparent that the invention substantially achieves all of the above aspects and advantages. Additional aspects and advantages of the invention will be set forth in the description that follows, and in part will be obvious from the description, or may be learned by practice of the invention. Moreover, the aspects and advantages of the invention may be realized and obtained by means of the instrumentalities and combinations particularly pointed out in the appended claims.

DESCRIPTION OF THE DRAWINGS

The accompanying drawings illustrate presently preferred embodiments of the invention, and together with the general description given above and the detailed description given below, serve to explain the principles of the invention. As shown throughout the drawings, like reference numerals designate like or corresponding parts.

DETAILED DESCRIPTION OF THE PREFERRED EMBODIMENTS

Figure 1:
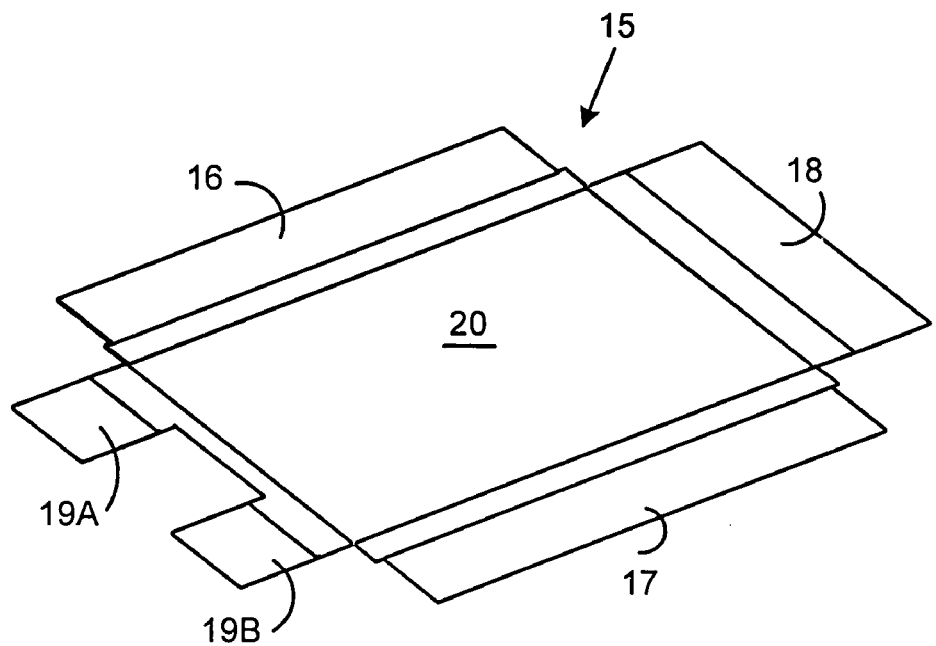
FIG. 1 is an isometric view of a tamper wrap used in a preferred embodiment of the present invention.

FIG. 1 is an isometric view of a preferred embodiment of tamper wrap 15 used in the present invention. Tamper wrap 15 is formed from a flexible film material. Tamper wrap 15 is intended to be wrapped around a PCB to protect the PCB from tampering attempts. In the preferred embodiment of the present invention, tamper wrap 15 includes first side tab 16 opposite second side tab 17 and third side tab 18 opposite fourth side tabs 19A and 19B, all extending from main body portion 20. This preferred tamper wrap 15 shown in FIG. 1 is particularly adapted for use as part of the printed circuit board assembly described in the co-pending U.S. application Ser. No. 10/868,337, entitled "Tamper Barrier for Electronic Device" assigned to the assignee of the present invention. The printed circuit board assembly described in that application includes a tamper wrap that only partially envelops the PCB (first side tab 16, second side tab 17, third side tab 18 and fourth side tabs 19A and 19B do not wrap around and cover the entirety of the top surface of the PCB). In addition, the printed circuit board assembly described in that application includes a PCB having an outwardly extending tab, and thus preferred tamper wrap 15 shown in FIG. 1 is provided with two fourth side tabs 19A and 19B to accommodate the tab (it fits between fourth side tabs 19A and 19B). It will be appreciated, however, that the method of installing a tamper barrier wrap according to present invention is not limited to use in connection with the printed circuit board assembly described in that application, but instead may be used in any tamper protection application that requires the attachment of a tamper barrier wrap. Thus, a single tab 19, similar to third side tab 18, may be provided on tamper wrap 15 for PCBs that do not include an outwardly extending tab, and the side tabs 16 through 19 may be adapted to wrap around and cover the entirety of the PCB without departing from the present invention.

Tamper wrap 15 is provided with an adhesive on the top surfaces of first side tab 16, second side tab 17, third side tab 18 and fourth side tabs 19A and 19B and on the bottom surface of main body portion 20. The top surfaces of first side tab 16, second side tab 17, third side tab 18 and fourth side tabs 19A and 19B are the surfaces that face outwardly and can be seen in FIG. 1. The bottom surface of main body portion 20 is the surface thereof that is not visible in FIG. 1. Preferably, the adhesives are covered with a removable release layer to protect the adhesives and prevent them from sticking to anything until desired.

Figure 2:
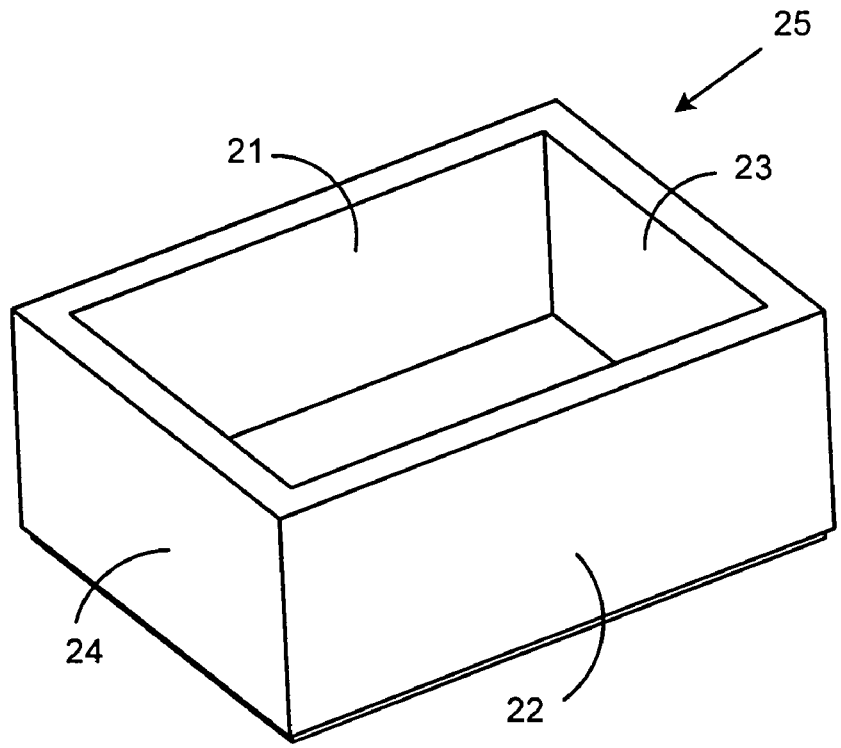
FIG. 2 is an isometric view of an installation tool used in a preferred embodiment of the present invention.

Referring to FIG. 2, an isometric view of a preferred embodiment of an installation tool 25 used in the method of the present invention is shown. Installation tool 25 has a shape that matches the general shape of main body portion 20 of tamper wrap 15 and the PCB to be wrapped in tamper wrap 15. In the preferred embodiment, the PCB to be wrapped has a generally rectangular shape, and thus the preferred installation tool 25 has a rectangular shape. Specifically, installation tool 25 shown in FIG. 2 includes first side wall 21, second side wall 22, third side wall 23, and fourth side wall 24. It will be appreciated, however, that installation tool 25 may have different shapes, for example, triangular, pentaganol or hexagonal shapes, depending on the general shape of the particular PCB to be wrapped.

Figure 3:
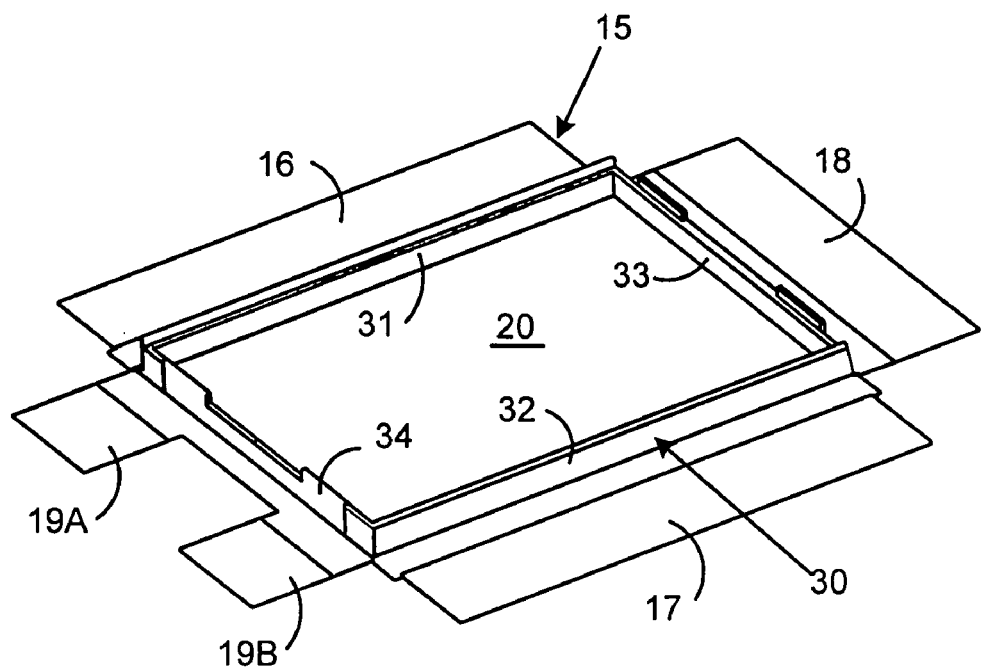
FIG. 3 is an isometric view of a PCB locating frame placed on the tamper wrap shown in FIG. 1 according to a preferred embodiment of the present invention.
Figure 4:
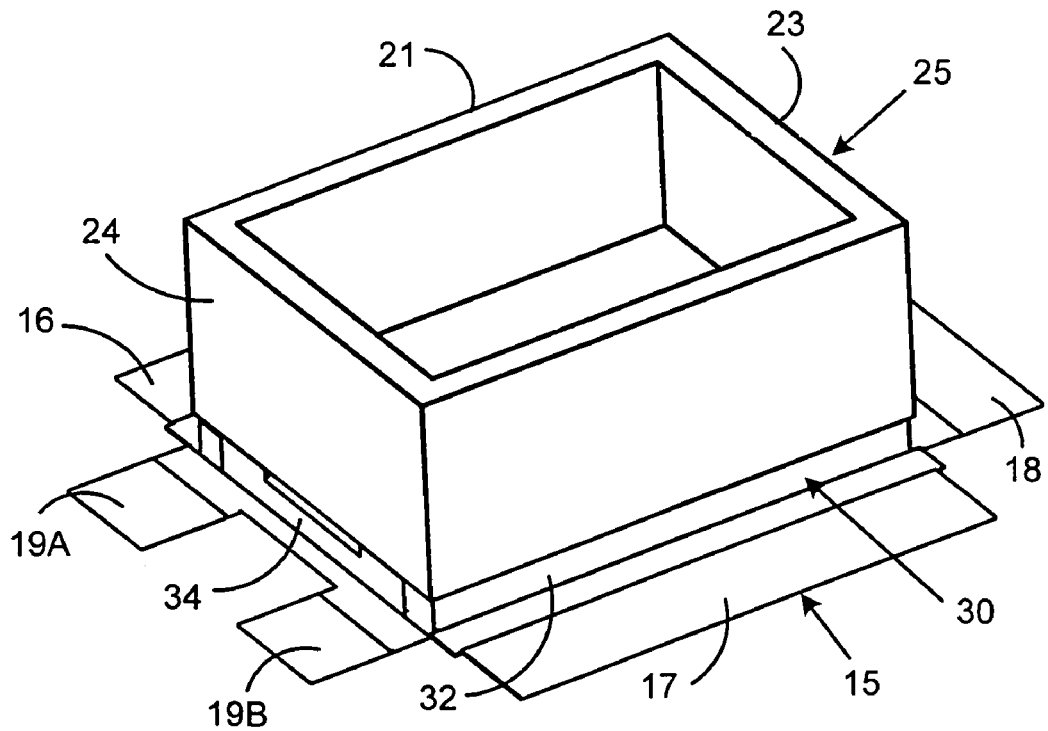
FIG. 4 is an isometric view of the installation tool of FIG. 2 placed on the PCB locating frame shown in FIG. 3 according to a preferred embodiment of the present invention.
Figure 5:
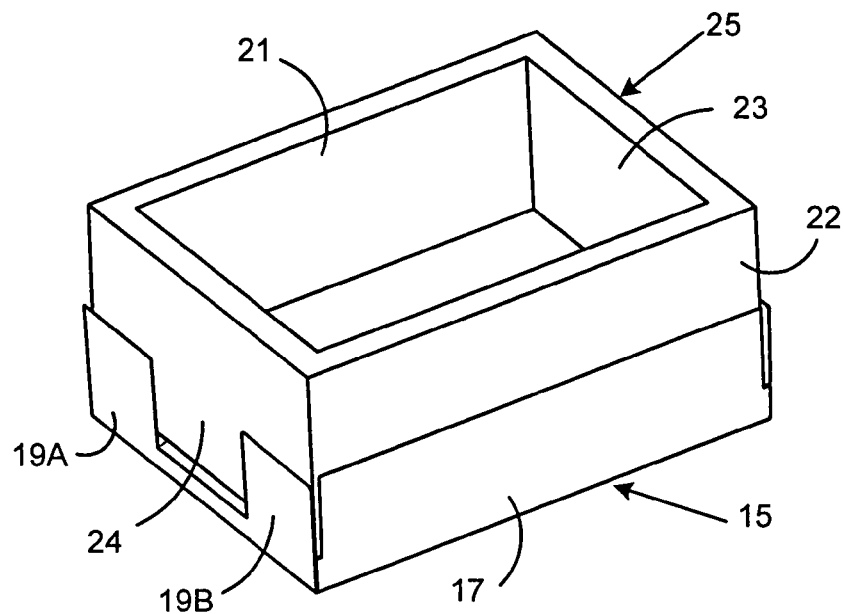
FIG. 5 is an isometric view showing the side tabs of the tamper wrap shown in FIG. 1 folded up against the side walls of the installation tool and the PCB locating frame shown in FIG. 4 according to a preferred embodiment of the present invention.

Referring to FIG. 3, in the first step of the method of installing a tamper barrier wrap according to a preferred embodiment of the present invention, tamper wrap 15 is laid out flatly and PCB locating frame 30 is placed over main body portion 20 of tamper wrap 15. PCB locating frame 30 is used to properly align the PCB to be wrapped during the tamper barrier wrap installation process. PCB locating frame 30 consists of a hollow frame that matches the general shape of installation tool 25. Thus, in the preferred embodiment shown in FIG. 3, PCB locating frame 30 is rectangular in shape and includes first side wall 31, second side wall 32, third side wall 33 and fourth side wall 34. Preferably, the height of side walls 31, 32, 33 and 34 is greater than or equal to the thickness of the PCB to be wrapped. Next, as shown in FIG. 4, installation tool 25 is placed on top of PCB locating frame 30. The removable release layers covering first side tab 16, second side tab 17, third side tab 18 and fourth side tabs 19A and 19B are then removed to expose the adhesive. Referring to FIG. 5, each of first side tab 16, second side tab 17, third side tab 18 and fourth side tabs 19A and 19B are then folded up against installation tool 25 and PCB locating frame 30. In particular, first side tab 16 is folded up against side wall 21 of installation tool 25 and side wall 31 of PCB locating frame 30, second side tab 17 is folded up against side wall 22 of installation tool 25 and side wall 32 of PCB locating frame 30, third side tab 18 is folded up against side wall 23 of installation tool 25 and side wall 33 of PCB locating frame 30, and fourth side tabs 19A and 19B are folded up against side wall 24 of installation tool 25 and side wall 34 of PCB locating frame 30. In the preferred embodiment, the exterior of side walls 21, 22, 23 and 24 of installation tool 25 are treated with or otherwise made of a material that prevents the adhesive provided on first side tab 16, second side tab 17, third side tab 18 and fourth side tabs 19A and 19B from sticking thereto. For example, the exterior of side walls 21, 22, 23 and 24 could be sprayed with a non-stick material. As a result, first side tab 16, second side tab 17, third side tab 18 and fourth side tabs 19A and 19B will stick to side walls 31, 32, 33 and 34 of PCB locating frame 30, thereby holding tamper wrap 15, and in particular first side tab 16, second side tab 17, third side tab 18 and fourth side tabs 19A and 19B, in place as shown in FIG. 5, but will not stick to side walls 21, 22, 23 and 24 of installation tool 25. This latter fact is important because, as described below, installation tool 25 will need to be removed in subsequent steps.

Figure 6:
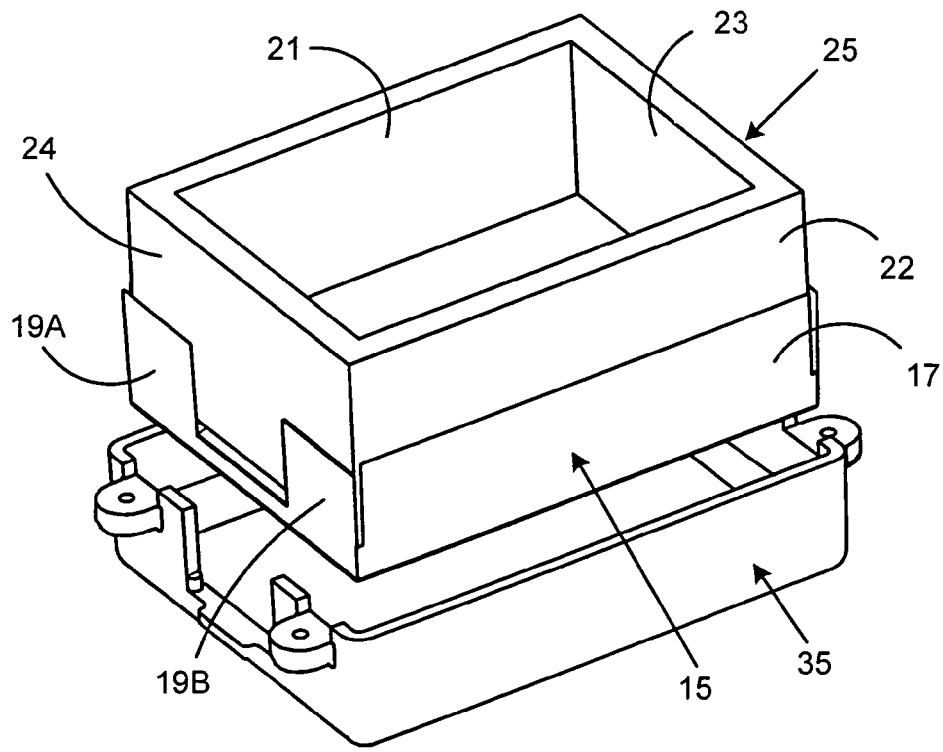
FIG. 6 is an isometric view showing the tamper wrap, installation tool and the PCB locating frame being inserted into an enclosing case according to a preferred embodiment of the present invention.
Figure 7:
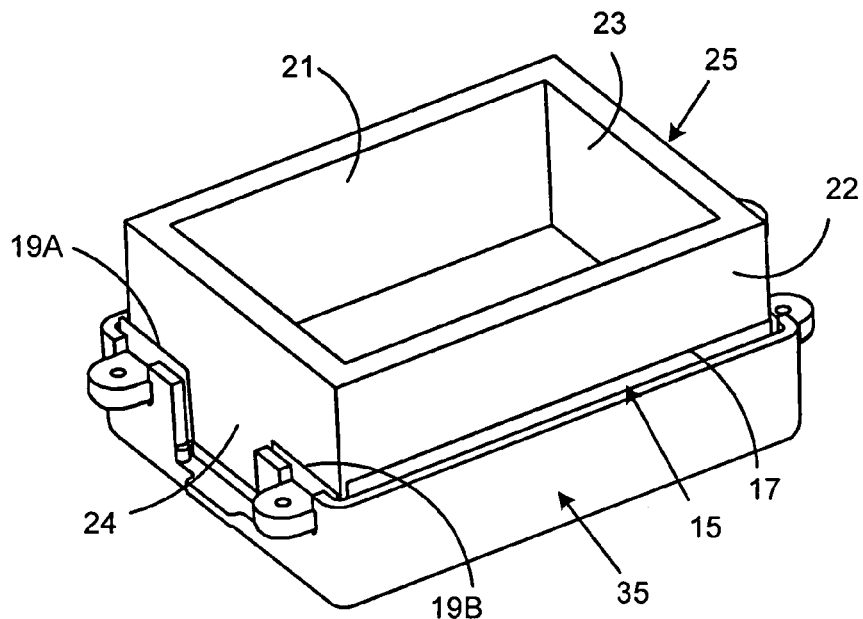
FIG. 7 is an isometric view showing the tamper wrap, installation tool and the PCB locating frame after being inserted into an enclosing case according to a preferred embodiment of the present invention.
Figure 8:
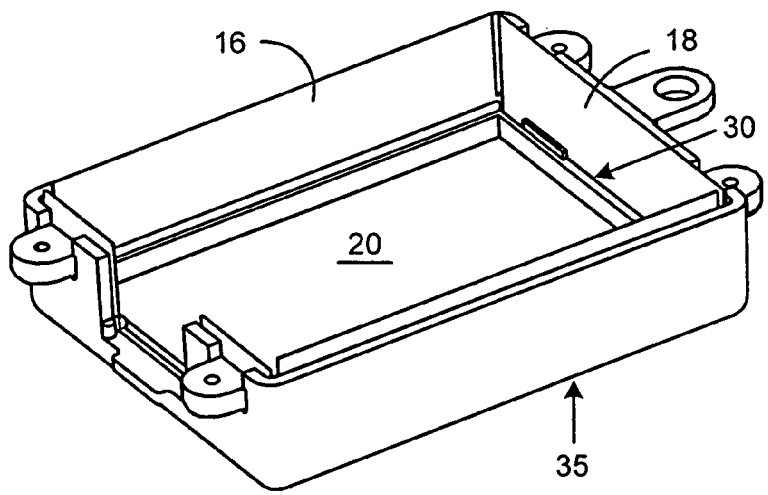
FIG. 8 is an isometric view showing the tamper wrap and the PCB locating frame resting an enclosing case according to a preferred embodiment of the present invention after the installation tool has been removed.

Next, referring to FIGS. 6 and 7, the release layer covering the adhesive on the bottom surface of main portion 20 of tamper wrap 15 is removed and tamper wrap 15, installation tool 25 and PCB locating frame 30 are together placed in enclosing case 35. Enclosing case 35 is preferably made of a metal such as, for example, aluminum or zinc, and provides a protective barrier for the wrapped PCB. The adhesive provided on the bottom surface of main body portion 20 holds tamper wrap 15 in place in enclosing case 35. Controlled pressure may be applied to main body portion 20 to ensure that it is adhered to enclosing case 35. Installation tool 25 is then removed, leaving, as shown in FIG. 8, tamper wrap 15 and PCB locating frame 30 resting in enclosing case 35 ready to receive the PCB to be wrapped.

Figure 9:
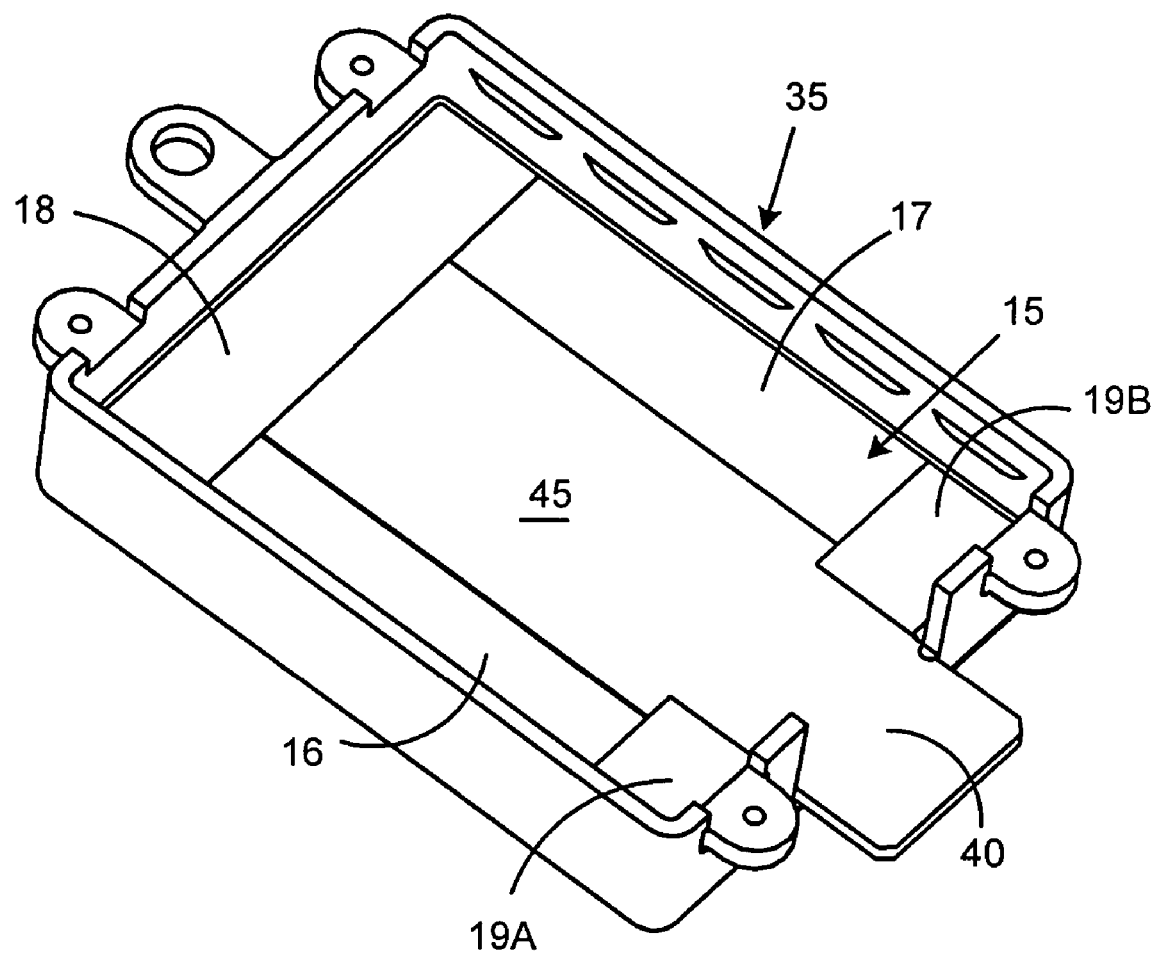
FIG. 9 is an isometric view showing a printed circuit board inserted into the enclosing case and wrapped in the tamper wrap according to a preferred embodiment of the present invention.

Next, a thermally conductive material or compound, such as, for example, Sil Pad®, is applied to the top surface of main body portion 20 of tamper wrap 15. The top surface of main body portion 20 may be provided with an adhesive to hold the thermally conductive material or compound in place. The PCB to be wrapped, shown at numeral 40 in FIG. 9, is then placed in the assembly shown in FIG. 8. In particular, PCB 40 is placed, electronic component side down, within PCB locating frame 30 and on top of the thermally conductive material or compound. An adhesive may be used on top of the thermally conductive material or compound to hold PCB 40 in place, or PCB 40 may be pressed into the thermal compound to ensure that the thermal compound fills all gaps. As a result, the electronic components, such as integrated circuit chips, provided on PCB 40 will be in thermal contact with the thermally conductive material or compound, which in turn is in thermal contact with tamper wrap 15, which in turn is in thermal contact with enclosing case 35. In this configuration, enclosing case 35, through tamper wrap 15 and the thermally conductive material or compound, acts as a heat sink for PCB 40 to dissipate the heat generated by the electronic components mounted thereon. First side tab 16, second side tab 17, third side tab 18 and fourth side tabs 19A and 19B are then folded down and adhered to the top surface 45 of PCB 40. In the embodiment shown in FIG. 9, as discussed above, first side tab 16, second side tab 17, third side tab 18 and fourth side tabs 19A and 19B only partially cover top surface 45. However, it will be appreciated that first side tab 16, second side tab 17, third side tab 18 and fourth side tabs 19A and 19B may cover the entirety of top surface 45 without departing from the scope of the present invention. A cover (not shown) is then affixed to enclosing case 35 buy any suitable means, such as, for example, by bonding, welding, or screwing, to completely cover the wrapped PCB 40.

In an alternative embodiment of the present invention, rather than placing PCB locating frame 30 on tamper wrap 15 prior to insertion into enclosing case 35 as shown in FIG. 3, installation tool 25 is instead placed directly on top of tamper wrap 15. Side tabs 16, 17, 18 and 19A and 19B are then folded up against side walls 21, 22, 23 and 24 of installation tool 25 (preferably after removing the release layers), and tamper wrap 15 and installation tool 25 are together inserted into enclosing case 35 (after removing the release layer covering the adhesive on the bottom surface of main body portion 20). During the transfer of tamper wrap 15 and installation tool 25 into enclosing case 35, side tabs 16, 17, 18 and 19A and 19B may be held up in place against side walls 21, 22, 23 and 24 of installation tool 25 by any number of ways, including manual pressure, a clamp or elastic member wrapped around installation tool 25. It should be noted that these alternatives for holding side tabs 16, 17, 18 and 19A and 19B in place may also be used in the preferred embodiment described above (in which PCB locating frame is placed on tamper wrap 15 prior to insertion into enclosing case 35), in which case the release layers covering the adhesive provided on side tabs 16, 17, 18 and 19A and 19B may be left in place until after PCB 40 is inserted into enclosing case 35. Returning to the description of the alternative embodiment, installation tool 25 is then removed, leaving tamper wrap 15 resting inside enclosing case 35 with side tabs 16, 17, 18 and 19A and 19B being held up against the walls of enclosing case 35. Next, PCB locating frame 30 is placed inside enclosing case 35 on top of main body portion 20 of tamper wrap 15 (the result being as shown in FIG. 8), and the method continues as described above in connection with FIG. 9. As a further alternative, PCB locating frame 30 could be omitted completely. In this case, PCB 40 would be placed inside enclosing case 35 on top of the thermally conductive material or compound provided on main body portion 20 of tamper wrap 15 without the aid of PCB locating frame 30.

While preferred embodiments of the invention have been described and illustrated above, it should be understood that these are exemplary of the invention and are not to be considered as limiting. Additions, deletions, substitutions, and other modifications can be made without departing from the spirit or scope of the present invention. Accordingly, the invention is not to be considered as limited by the foregoing description but is only limited by the scope of the appended claims.

What is claimed is:

1. A method of attaching a flexible tamper wrap to a printed circuit board, said tamper wrap having a main body portion and a plurality of side tabs extending from said main body portion, said method comprising the steps of:
    laying said tamper wrap out flatly;
    placing an installation tool over said main body portion, said installation tool having a plurality of side walls equal in number to said plurality of side tabs;
    folding each of said side tabs up against a corresponding one of said side walls of said installation tool;
    inserting said tamper wrap and said installation tool into an enclosing case;
    removing said installation tool from said enclosing case;
    placing said printed circuit board into said enclosing case over said main body portion of said tamper wrap; and
    folding and adhering said plurality of said tabs down onto a top surface of said printed circuit board.

2. A method according to claim 1, further comprising the step of placing a locating frame on top of said main body portion after said laying step, wherein said step of placing an installation tool over said main body portion further comprises placing said installation tool on top of said locating frame, and wherein said inserting step further comprises inserting said locating frame into said enclosing case together with said tamper wrap and said installation tool.

3. A method according to claim 2, said locating frame having a plurality of side walls equal in number to said plurality of side tabs, said folding step further comprising folding each of said side tabs up against a corresponding one of said locating frame side walls.

4. A method according to claim 3, said side tabs each having an adhesive on a first surface thereof, said adhesive sticking to said locating frame side walls and not sticking to said installation tool side walls.

5. A method according to claim 1, further comprising the step of placing a locating frame on top of said main body portion after said removing step, said step of placing said printed circuit board in said enclosing case further comprising placing said printed circuit board inside said locating frame.

6. A method according to claim 1, further comprising the step of placing a thermally conductive material on top of said main body portion after said removing step, said step of placing said printed circuit board in said enclosing case further comprising placing said printed circuit board on top of said thermally conductive material.

7. A method according to claim 6, said printed circuit board having an electronic component side, said electronic component side being in thermal contact with said thermally conductive material.

8. A method according to claim 1, said installation tool having four side walls and a rectangular shape, said tamper wrap having four side tabs.

9. A method according to claim 1, a bottom surface of said main body portion of said tamper wrap having an adhesive, said adhesive adhering to said enclosing case during said inserting step.

10. A method according to claim 1, said enclosing case including a plurality of side walls equal in number to said side plurality of side tabs, wherein after said removing step and before said folding step, each of said side tabs rests against a corresponding one of said side walls of said enclosing case.

11. A method according to claim 1, wherein after said folding step, said side tabs cover only a portion of said top surface of said printed circuit board.

12. A method according to claim 1, wherein after said folding step, said side tabs cover the entirety of said top surface of said printed circuit board.

* * * * *